(12) United States Patent
Cleeves

(10) Patent No.: US 7,081,377 B2
(45) Date of Patent: Jul. 25, 2006

(54) THREE-DIMENSIONAL MEMORY

(75) Inventor: James M. Cleeves, Redwood City, CA (US)

(73) Assignee: Sandisk 3D LLC, Milpitas, CA (US)

(*) Notice: Subject to any disclaimer, the term of this patent is extended or adjusted under 35 U.S.C. 154(b) by 66 days.

(21) Appl. No.: 10/185,508

(22) Filed: Jun. 27, 2002

(65) Prior Publication Data
US 2004/0002184 A1  Jan. 1, 2004

(51) Int. Cl.
*H01l 21/82* (2006.01)
(52) U.S. Cl. .................. 438/131; 438/600
(58) Field of Classification Search .......... 438/201, 438/210–212, 128–132, 197, 381, 600, 749–751, 438/319; 365/130, 113; 257/20
See application file for complete search history.

(56) References Cited

U.S. PATENT DOCUMENTS

| | | | | |
|---|---|---|---|---|
| 5,110,754 A | * | 5/1992 | Lowrey et al. | 437/52 |
| 5,835,396 A | * | 11/1998 | Zhang | 365/51 |
| 6,420,215 B1 | * | 7/2002 | Knall et al. | 438/131 |
| 6,515,888 B1 | * | 2/2003 | Johnson et al. | 365/130 |

* cited by examiner

*Primary Examiner*—Tuan H. Nguyen

(57) ABSTRACT

A 3D semiconductor memory is described having rail-stacks which define conductive lines and cells. The memory levels are organized in pairs with each pair showing common lines in adjacent levels.

7 Claims, 5 Drawing Sheets

THREE-DIMENSIONAL MEMORY

BACKGROUND OF THE INVENTION

1. Field of the Invention

This invention relates to the field of semiconductor memories.

2. Prior Art

Recently there has been more interest in fabricating three-dimensional (3D) memory arrays, that is, memories having cells disposed at numerous levels above a substrate. Each level includes a plurality of spaced-apart first lines extending in one direction. The first lines are vertically separated from a plurality of parallel spaced-apart second lines running in a second direction, for example, extending perpendicular to the first lines. Memory cells are disposed between the first lines and second lines at the projected intersection of the lines. These memories are described in U.S. Pat. Nos. 5,835,396 and 6,034,882.

In U.S. patent application Ser. No. 09/560,626 filed Apr. 28, 2000, entitled "Three-Dimensional Memory Array and Method of Fabrication," a 3D memory is described using rail-stacks which define both the lines and the memory cells of an array. Each cell includes an antifuse layer. A diode is formed once the cell is programmed. In a subsequent application, Ser. No. 09/841,727 filed Mar. 21, 2001, entitled "Three-Dimensional Memory Array and Method of Fabrication," an improved 3D memory also employing rail-stacks is described. In this application, P+N– diodes are used to reduce leakage current.

The present invention is an improvement of the memory described in the above-referenced applications. It permits better scalability and lower leakage current, as will be described.

SUMMARY OF THE INVENTION

A memory array formed above a substrate having a plurality of levels is described. The memory levels are organized in pairs, one from a first alternate level and the other from a second alternate level. Each level includes a plurality of two terminal memory cells. One terminal of the cells in the first alternate levels and the second alternate levels share common first lines. The other terminals of the cells in the first alternate levels are coupled to second lines in the first alternate levels. The other terminal of the cells in the second alternate levels are coupled to third lines in the second alternate levels. In this way, cells in a pair of levels are coupled to a shared or common line, with the other terminals of the cells being coupled either to the second or third lines.

BRIEF DESCRIPTION OF THE DRAWINGS

The present invention is illustrated by way of example and not intended to be limited by the figures of the accompanying drawings.

DETAILED DESCRIPTION

A three-dimensional (3D) memory and memory array is described. Both a method of fabrication and the memory itself is described below. In some instances, specific details are set forth, such as layer thicknesses, doping levels, etc. in order to provide a thorough understanding of the present invention. It will be apparent to one skilled in the art that the present invention may be practiced without use of these specific details. In other instances, well-known technologies, particularly fabrication technologies, are not described in detail in order not to unnecessarily obscure the present invention.

Figure 3:
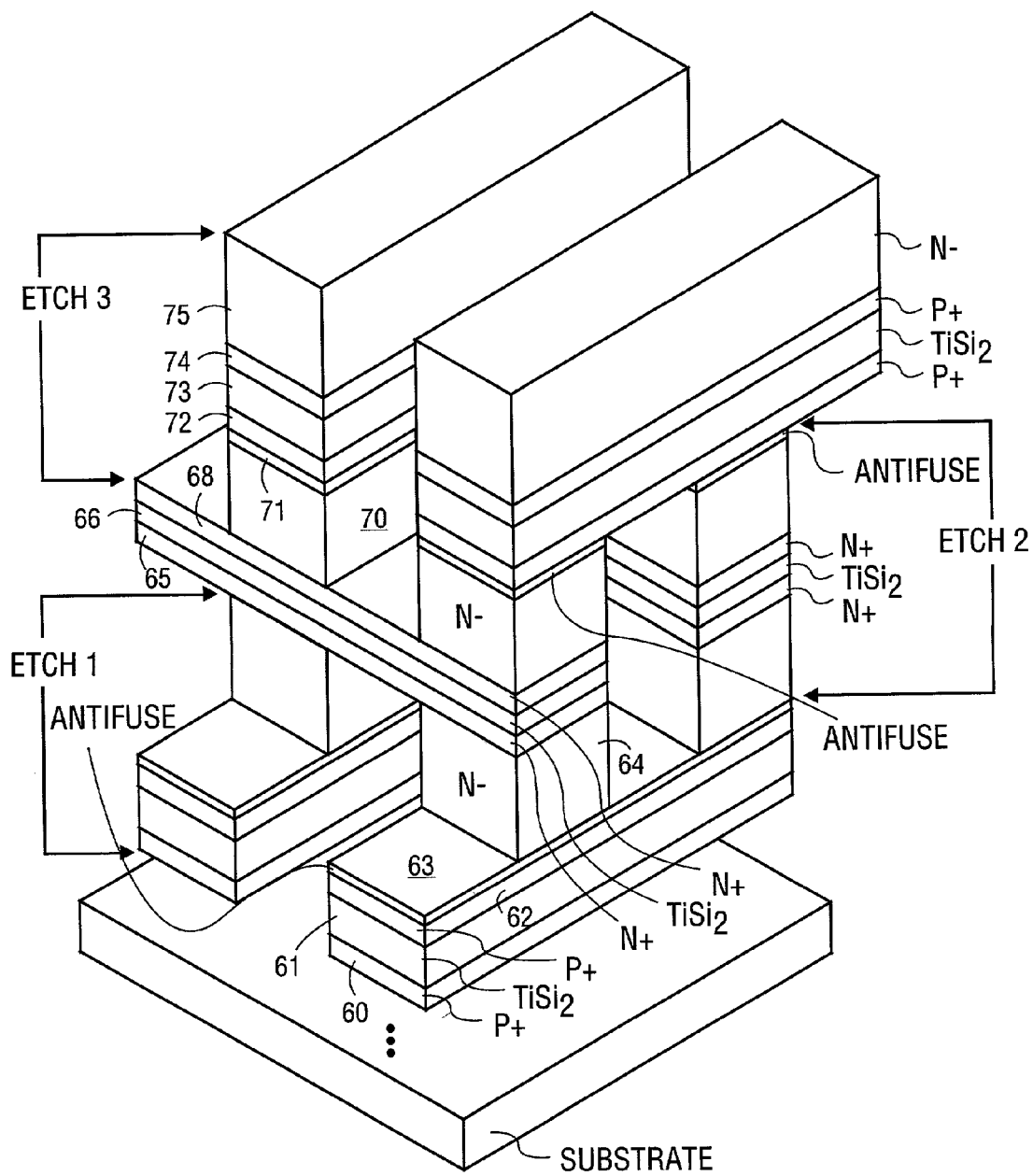
FIG. 3 is a cut-away, perspective view of a memory array for another embodiment of the present invention.
Figure 4:
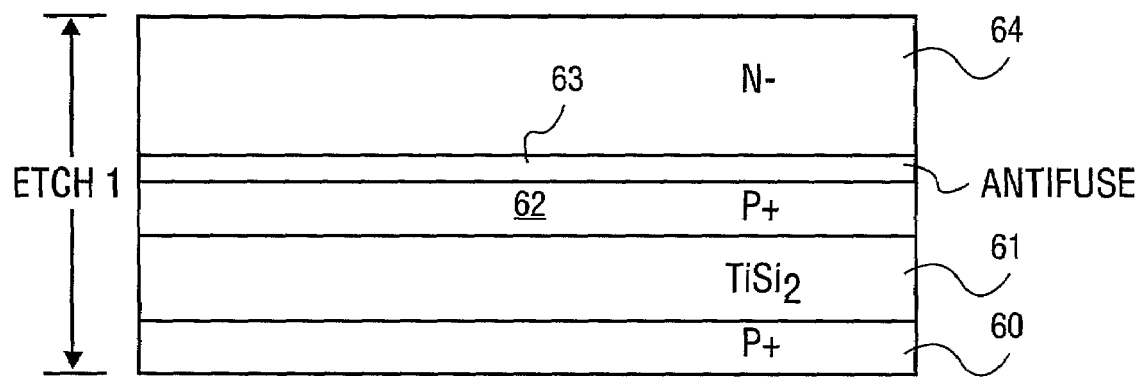
FIG. 4 is a cross-sectional elevation view, illustrating several layers forming a first rail-stack for the embodiment of FIG. 3.
Figure 5:
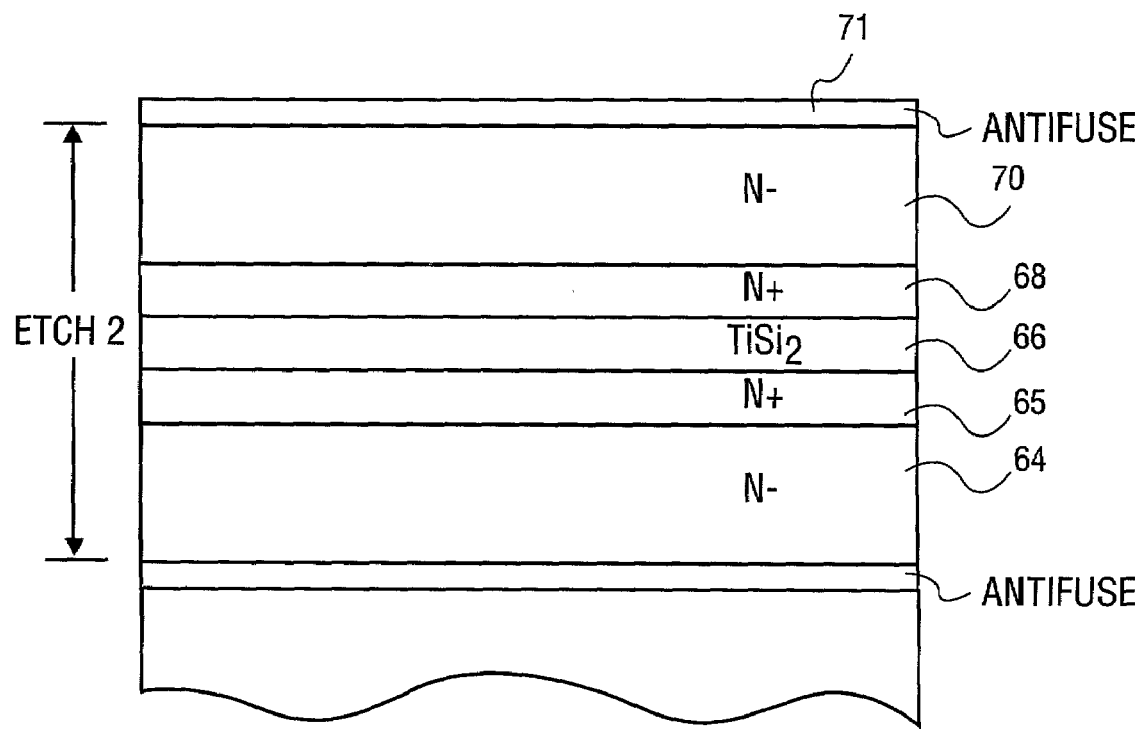
FIG. 5 illustrates the structure of FIG. 4 after several processing steps and the formation of additional layers.
Figure 6:
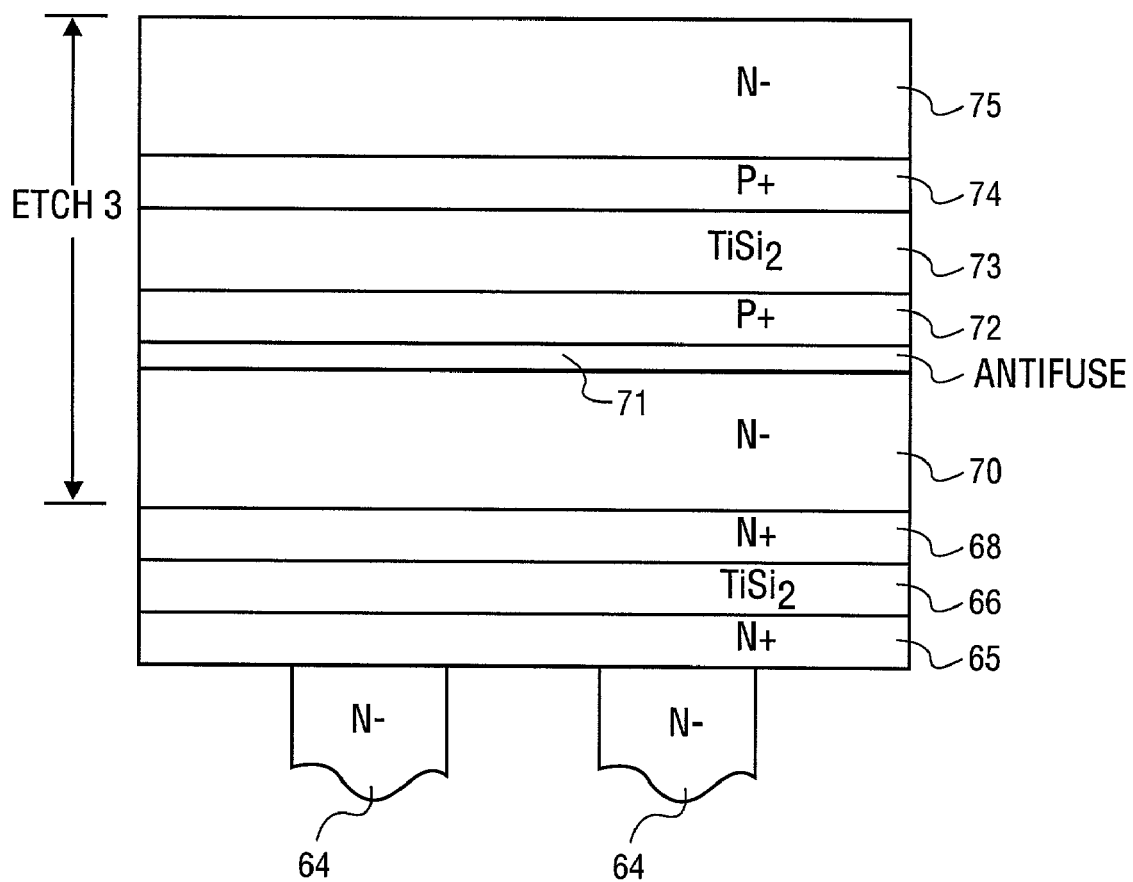
FIG. 6 illustrates the structure of FIG. 5 after additional processing and after several additional layers are formed.

In the following description, first the general architecture of the memory is described for one embodiment. Then the embodiment of FIG. 3 is set forth followed by the method of fabrication of this embodiment, which is shown in FIGS. 4–6.

As will be seen, blanket layers of material are etched to form rail-stacks, which include lines of conductors, etc for one embodiment (pillar structures can also be used, as will be discussed later). The lines, etc. in a rail-stack formed from a blanket layer are numbered with the same number as the layer. Thus, if a layer x is etched into several lines, these lines are referred to as lines x. This provides a better understanding of how the layers are etched into the rail-stacks.

General Architecture of the Invented Memory

The memory array (i.e., the organization of the memory cells with the conductive path for accessing them) of the present invention is fabricated above a substrate in a plurality of levels. The peripheral circuits for accessing the cells are fabricated, within and on, the substrate as described in the above-referenced patents and applications. Each memory level of the array includes a plurality of two terminal memory cells each of which may comprise a diode and an antifuse layer connected in series.

Figure 1:
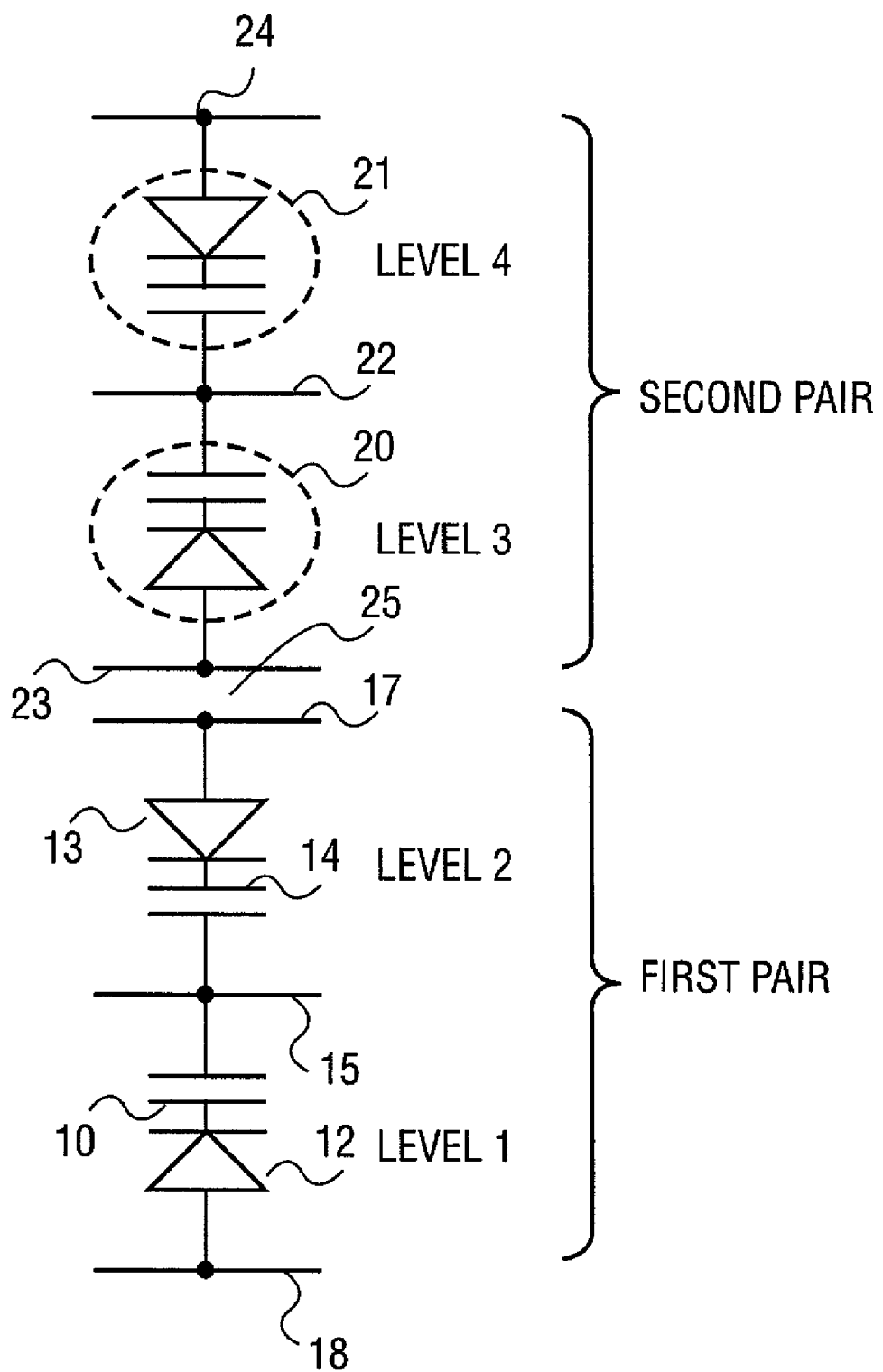
FIG. 1 is a schematic, illustrating the organization of memory cells for one embodiment of the invented memory.

Referring to FIG. 1, four levels of the memory array are shown. In level 1, a single one of the cells is illustrated having a diode 12 and an antifuse layer 10, shown as a capacitor structure. One terminal of the cell is coupled to line 18 and the other terminal of the cell is coupled to line 15. The next memory array level, level 2, again includes a cell comprising a diode 13 and an antifuse layer 14. One terminal of this cell is coupled to line 15 and the other terminal is coupled to line 17. As is apparent, the cells illustrated in levels 1 and 2 share the line 15.

Similarly, the next two levels of the array, levels 3 and 4, comprise a cell 20 and a cell 21, respectively. Cells 20 and 21 again includes a diode connected in series with an antifuse layer. One terminal of the cell 20 and one terminal of the cell 21 are coupled to the shared, common line 22. The other terminal of the cell 20 is coupled to a second line 23, and the other terminal of the cell 21 is coupled to a third line 24. As will be seen, the lines are integrally formed in rail-stacks which also define the cells.

The array levels, as seen above, are organized in pairs, with the first pair comprising the levels 1 and 2, and the second pair comprising the levels 3 and 4. In one embodiment, the first pair of levels are separated from the second pair of levels by an insulative layer, shown as layer 25.

While only a single cell is shown at each level in FIG. 1, in practice a plurality of cells are found at each level. Additionally, a plurality of the first, second, and third lines associated with every pair of cells exists in each level of the array. Moreover, while four levels are shown in FIG. 1, more levels, for instance, eight may be formed in the 3-D array. The overall organization however, remains the same as shown in FIG. 1 for this embodiment. More specifically, one terminal of the cells in each of the first alternate levels (e.g., levels 1 and 3) share common lines (e.g., lines 15 and 22) with one terminal of the cells in the second alternate levels (e.g., levels 2 and 4). The other terminals of the cells in each of the first alternate levels, are coupled to second lines (e.g., lines 18 and 23). The other terminal of the cells in each of the second alternate levels are coupled to third lines (e.g., lines 17 and 24). Also while in FIG. 1, the diodes of the cells "point" away from the common lines 15 and 22, they can point to these common lines.

In the embodiments described below, the first, second, and third lines along with the cells, are fabricated as rail-stacks, as will be described in more detail. Some of the layers that are used to define these rail-stacks are etched twice. This results in one or both diodes in each pair of levels having one of its regions (an N− region) reduced in its cross-section. This prevents the lateral spreading of the leakage current and thus reduces leakage current.

Figure 2:
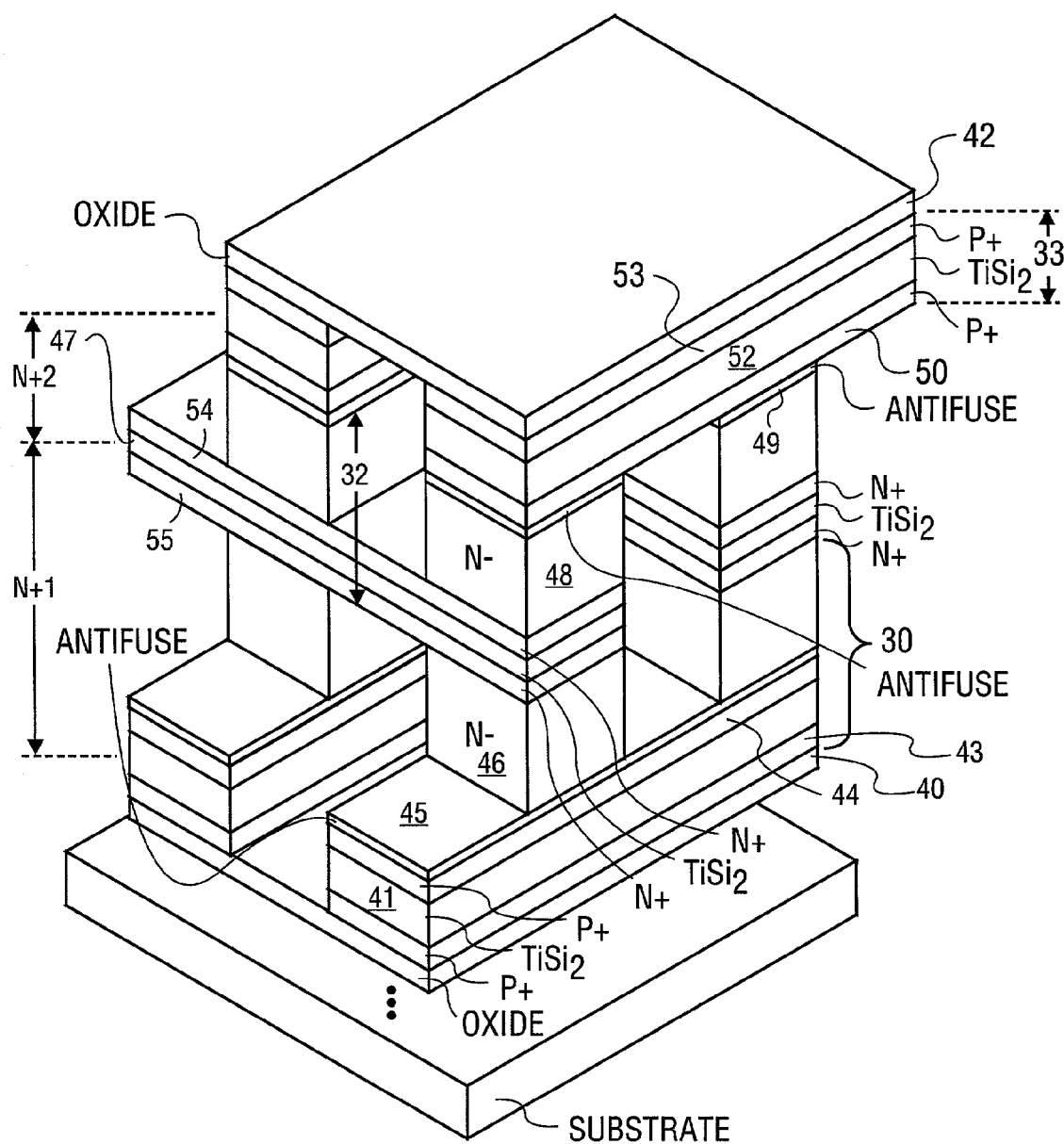
FIG. 2 is a cut-away, perspective view of two memory levels for an embodiment of the invented memory.

Embodiment of FIG. 2

In FIG. 2, two levels of the memory for one embodiment are illustrated, specifically, levels N+1 and N+2. Level N+1 comprises a plurality of parallel, spaced-apart rail-stacks, such as stacks 30. A plurality of parallel, spaced-apart rail-stacks such as rail-stacks 32, are disposed above and perpendicular to the rail-stacks 30. Another plurality of parallel, spaced-apart rail-stacks 33 are disposed above the rail-stack 32, and are perpendicular to rail-stack 32.

Each pair of memory levels are separated by an oxide layer, such as layers 40 and 42 shown below and above level N and level N+1. Additionally, the space between the spaced-apart rail-stacks is filled with an insulator such as silicon dioxide which is not shown in FIG. 2.

The structure of FIG. 2 can be mapped onto the schematic of FIG. 1. For example, the titanium silicide line 47 of rail-stack 32, corresponds to the shared line 15. The N junction of the diodes 12 and 13, are N− layers 46 and 48, respectively. For the embodiment of FIG. 2, the antifuse layers are disposed between the P+ and N− regions of the diode, whereas in FIG. 1 the antifuse layers are shown apart from the diode. Taking this into consideration, the antifuse layers 10 and 14 of FIG. 1 correspond to layers 45 and 49 of FIG. 2. The other region of the diodes 12 and 13 of FIG. 1 are the P+ layers 44 and 50 of FIG. 2. In one embodiment, P+N− diodes are preferred since in some processes these diodes have less leakage than, for instance, P−N+ diodes. The conductor 18 of FIG. 1 is the layer 41 of FIG. 2, and similarly, the conductor 17 of FIG. 1 is the layer 52 of FIG. 2. The P+ regions 43 and 50, while shown in FIG. 2, may, in part, be consumed in the formation of the titanium silicide conductors. This is also true for N+ layer 55.

With the antifuse layers formed between the P and N regions of the diode, the diode junction does not become effective until such time as the antifuse layer is breached. This occurs when the cell is programmed as described in the above-referenced patent applications.

The fabrication of the embodiment of FIG. 2 will become apparent in connection with the description of the embodiment of FIG. 3 and its fabrication as described in conjunction with FIGS. 4–6.

Embodiment of FIG. 3

In the embodiment of FIG. 3, the memory levels are not paired as they are in the embodiment of FIG. 2. Rather, each of the conductors between the memory levels is shared by the diode above and below the conductor. Two complete memory levels are shown in FIG. 3, formed from three levels of rail-stacks which are identified as etch 1, etch 2, and etch 3. The "etch" designation is used, as will be discussed later, to described the fabrication of the embodiment of FIG. 3.

In the first memory level of FIG. 3, memory cells are disposed between the conductors 61 and 66. These memory cells include the P+ layer 62, antifuse layer 63, and an N− layer 64. Again, there is an N+ layer 65 disposed between the N− layer 64 and the conductor 66. There is also a P+ layer 60 disposed below the conductor 61 which may be used in the formation of the silicide of conductor 61 and for cells formed below conductor 61.

On the second level of memory cells shown in FIG. 3, cells are disposed between the conductor 66 and the conductor 73. These cells include the N− layer 70 and the P+ layer 72 with an antifuse layer 71 disposed between these layers. Again, a N+ layer 68 is formed between the conductor 66 and the layer 70. Also in FIG. 3, there is a P+ layer 74 and an N− layer 75 formed above the conductor 73 which are used to form cells above the two complete memory cell levels shown FIG. 3.

While not shown in FIG. 3, and as was the case in FIG. 2, the spaces between the structures shown are filled with dielectric material such as silicon dioxide.

Fabrication of the Embodiment of FIG. 3

Referring first to FIG. 4, the first rail-stack of FIG. 3 is fabricated from a P+ layer 60, a titanium silicide layer 61, a P+ layer 62, an antifuse layer 63, and an N− layer 64. The layers 60, 61, and 64 may be fabricated from a semiconductor material such as polysilicon or amorphous silicon. These layers may be doped in-situ or through ion implantation or a combination thereof.

In one embodiment, layer 60 is approximately 2000 Å thick when deposited; layer 61, a 1,000 Å thick; and layer 62, 300 Å thick. The silicon from layer 60 is used to form the silicide of the conductor 61, the final thickness of layer 60 is approximately 1000 Å. The layer 63 may be a grown silicon dioxide layer, grown from layer 62 to a thickness of approximately 25–75 Å. The layer 64, in one embodiment, is initially 3,500 Å thick, and after planarization of the stack shown in FIG. 4, is approximately 2,000 Å thick. The layers 60 and 62 may be doped with a dopant such as boron to a dopant level of $1\times10^{19}$ atoms $cm^{-3}$ or greater. The layer 64 may be doped with a dopant such as phosphorous to a level of $1\times10^{17}$ atoms $cm^{-3}$ or less. Deposited silicon without dopant may be sufficiently N type for this purpose.

After the formation of the layers shown in FIG. 4, they are etched into parallel, spaced-apart rail-stacks. This is shown as etch 1 in FIG. 4. The spaces between the rail-stacks are filled with a filling material such as silicon dioxide before the planarization by polishing to expose the tops of the rail-stacks.

Following this, as shown in FIG. 5, additional layers are formed. These comprise the formation of the layers 65, 66, 68, 70, and 71. These layers are formed on the rail-stacks previously etched during etch 1. Consequently, these layers are formed over the first level of rail-stacks where the upper layer of the rail-stacks comprises layer 64.

The conductive layer 66 may be a titanium silicide layer with a thickness of approximately 1,000 Å. Layer 65 may be a polysilicon layer with an initial thickness of approximately 1500 Å. Its final thickness is approximately 500 Å after silicon from this layer is consumed in the formation of the overlying silicide. The N+ layer 68 may have a thickness of approximately 300 Å. The N− layer 70 may have an initial thickness of 3,500 Å. After planarization, with, for instance, chemical mechanical polishing (CMP), this layer may have a thickness of approximately 2,500 Å. The antifuse layer 71, for the illustrated embodiment, is grown from layer 70 to a thickness of 25–75 Å. Layer 71 and the other antifuse layer, in another embodiment, may be deposited silicon dioxide layers.

Once the layers 65, 66, 68, and 70 shown in FIG. 5 are formed, they are etched (etch 2) to form parallel, spaced-apart, rail-stacks perpendicular to the rail-stacks. Next, the space between the lines are filled with silicon dioxide. Then the rail-stacks are planarized. After planarization, the layer 71 is grown from layer 70.

Etch 2 also etches the layer 64. As best seen in FIG. 3, this results in the layer 64 becoming a plurality of pillar structures, since layer 64 is etched twice, first in alignment with a first rail-stacks, and secondly, in alignment with the second rail-stacks that include the conductor 66. Importantly, and as will be discussed, the total thickness of the layers etched for etch 2 is approximately 5,000–5,500 Å. The significance of this will become apparent shortly.

Now, additional layers are formed above the antifuse layer 71 of FIG. 5. Specifically, the layers 72, 73, 74, and 75 are now formed as shown in FIG. 6. The P+ layers 72 corresponds to layer 60 and may have the same initial and final thickness as well as doping level. The conductive layer 73 is titanium silicide and may have a thickness of approximately 1,000 Å. The N− layer 75 corresponds to layer 75 and may have a thickness layer of approximately 2,500 Å after CMP.

Following etch 3, the spaces between the rail-stacks on this level of rail-stacks are filled with a dielectric and then CMP occurs.

Now, a third etching step occurs which etches through layers 72–75 as well as layers 70 and 71. This forms the third level of rail-stacks shown in FIG. 3, and additionally, etches layers 70 and 71 in a second direction to form the pillar structures shown in FIG. 3. The total thickness for etch 3 is approximately 5,000–5,500 Å thick.

Importantly, etch 2 and etch 3 etch through layers having approximately the same thickness. With the layers shown, the depth of etching needed is divided evenly between the second and third etching steps, ignoring for a moment the first etching step. This results in the aspect ratio being relatively low. Unlike some prior art processes, the method of the present invention scales well since the depth of etches are divided approximately equally between the etching steps.

Note that for etch 1, only a partial memory level is being fabricated, and thus, for this etch the depth of etching is less. This occurs for the lowest and the highest level of rail-stacks in a memory array.

Other Fabrication and Operation Details for the Embodiments of FIGS. 2 and 3.

For both the embodiments of FIGS. 2 and 3, the substrate may be a monocrystaline silicon substrate on which the memory array is fabricated. Decoders, sense amplifiers, and other peripheral circuits may be fabricated within the substrate. Vias may extend from the various levels in the memory to the substrate to contact peripheral circuits.

With the paired memory levels as described above for FIGS. 1 and 2, only two levels of the memory need to be powered when data is being read from one of the two levels. In one prior art memory, each level of conductors in the array served memory cells above and below the conductor. With this arrangement, it is necessary to have three levels of the memory powered at any one time when accessing cells. Having one less level of memory powered, reduces the leakage current through those diodes that are unselected. Thus, the arrangement shown above reduces the leakage current when compared to some prior art 3D memories.

Additionally, in some prior art memories, memory cells were formed using rail-stacks of different heights. This meant that the aspect ratio (height-to-width ratio) of some of the rail-stacks were greater than others. With this arrangement, it is more difficult to scale the array to a smaller critical dimension without having the aspect ratio too high for reliable etching. With the present invention, as described above, this problem is mitigated by having at least some of the rail-stacks having the same height. For instance, with a 0.1 μm process and a maximum depth of etching of 5000 Å, the aspect ratio can be maintained at 5.

In alternate embodiments to the embodiments of FIGS. 2 and 3, the N type layers may be replaced with P type layers, and the P type layers, with N type layers. This will result in an N+/P− diode. In still other alternate embodiments, a P+/N− diode may be formed where the N type and P type layers of FIGS. 2 and 3 are interchanged if the diodes "point" in the opposite direction to the direction shown in FIGS. 2 and 3. In still another alternate embodiment, the antifuse layer may be formed on the opposite side of the lightly doped region, and thus it would be disposed between regions of the same conductivity type.

Thus, a memory, its array, and the method of fabricating the memory, has been described. In the 3D memory, memory levels are formed in pairs with rail-stacks that have approximately the same heights. Diode cross sections are reduced to lower leakage current.

What is claimed is:

1. In the fabrication of a three dimensional memory where memory cells are formed at the intersection of generally parallel, spaced-apart rail-stacks disposed at a plurality of rail-stack levels arranged one above the other, an improvement wherein the depth of etching in at least two etching steps used to form the rail-stacks in two adjacent rail-stack levels, arranged one above the other, approximately equal.

2. The improvement defined by claim 1, wherein each of the two etching steps etches a plurality of layers used to form the rail-stacks at one level of rail-stacks, and additionally partially etches rail-stacks in an underlying adjacent level of rail-stacks so as to form pillar structures in the underlying adjacent level of rail-stacks.

3. The improvement defined by claim 2, wherein the pillar structures comprise N− regions of silicon.

4. The improvement defined by claim 3, wherein the N− regions associated with diodes in the memory cells.

5. The improvement defined by claim 4, wherein the memory cells include an antifuse regions.

6. The improvement defined by claim 2, wherein the pillar structures are associated with diodes in the memory cells.

7. The improvement defined by claim 6, wherein the memory cells include antifuse regions.

* * * * *